United States Patent [19]
Hazani

[11] Patent Number: 5,247,346
[45] Date of Patent: Sep. 21, 1993

[54] E²PROM CELL ARRAY INCLUDING SINGLE CHARGE EMITTING MEANS PER ROW

[76] Inventor: Emanuel Hazani, Encinal Station, Sunnyvale, Calif. 94087-9998

[21] Appl. No.: 677,349

[22] Filed: Mar. 29, 1991

Related U.S. Application Data

[63] Continuation-in-part of Ser. No. 327,663, Mar. 22, 1989, Pat. No. 5,047,814, which is a continuation-in-part of Ser. No. 152,702, Feb. 5, 1988, Pat. No. 4,845,538.

[51] Int. Cl.⁵ ............. H01L 29/68; H01L 27/02; H01L 27/10; G11C 11/34
[52] U.S. Cl. ................. 257/314; 365/185; 257/499; 257/390
[58] Field of Search ............. 357/23.5, 45; 365/185

[56] References Cited

U.S. PATENT DOCUMENTS

| | | | |
|---|---|---|---|
| 4,845,538 | 7/1989 | Hazani | 357/23.5 |
| 4,853,895 | 8/1989 | Mitchell et al. | 357/23.5 |
| 5,047,814 | 9/1991 | Hazani | 357/23.5 |

Primary Examiner—Rolf Hille
Assistant Examiner—Robert Limanek

[57] ABSTRACT

An improved EEPROM having a cell including source and drain diffusions, a channel having a source region and a drain region, a floating gate that is disposed only over the drain region of the channel and has a coupling edge disposed adjacent to the drain diffusion to strongly capacitively couple the floating gate to the drain. During programming the floating gate voltage is increased, due to the capacitive coupling of the floating gate to the drain, which in turn inverts the drain region of the channel. The inversion of the drain region increases the coupling of the floating gate to the drain to increase electron tunneling to program the floating gate. Only three control signals are required to read, program, and erase the cell.

17 Claims, 9 Drawing Sheets

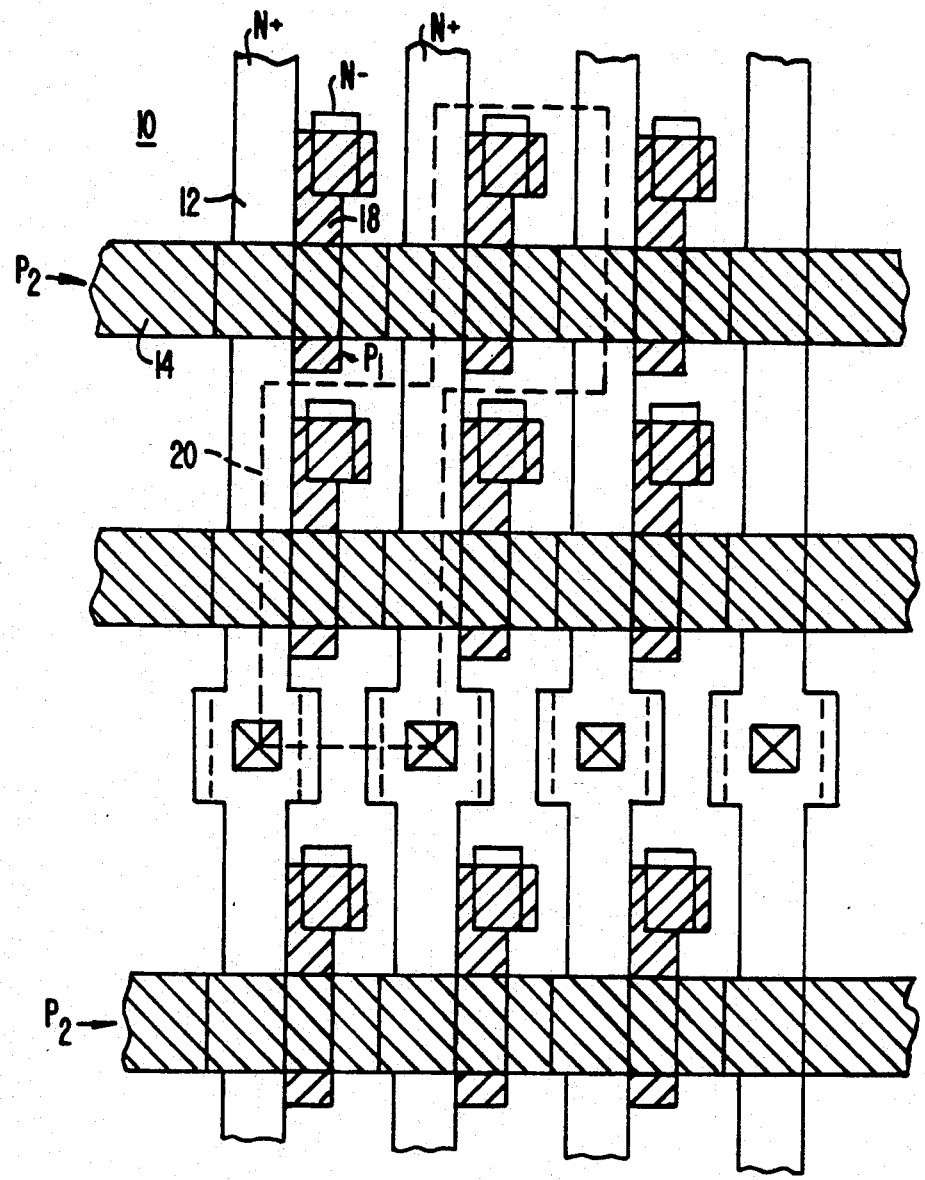
FIG._1.

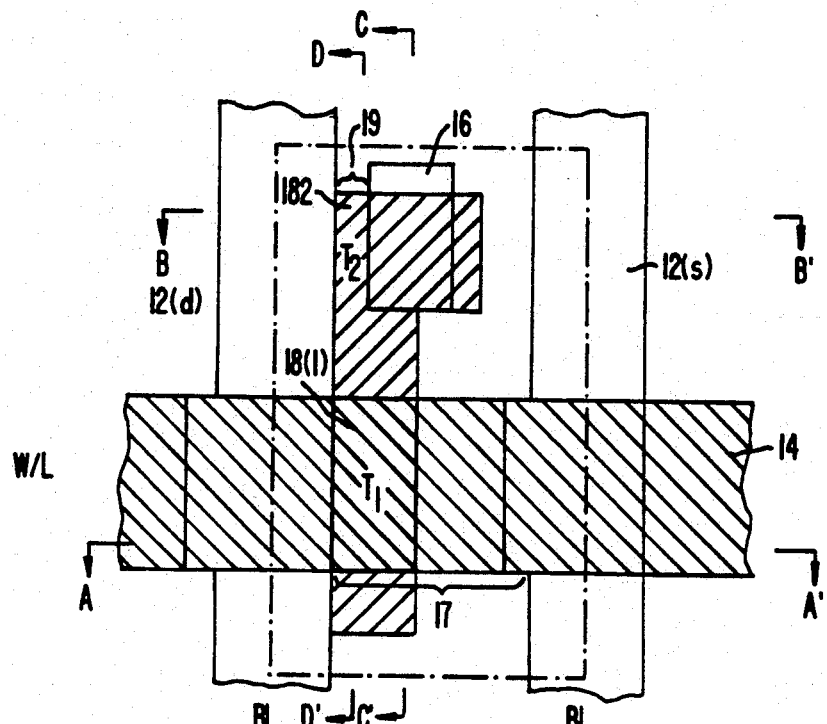
FIG._2.
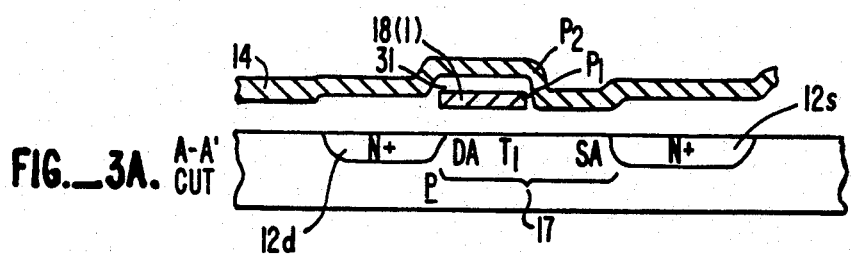
FIG._3A. A-A' CUT
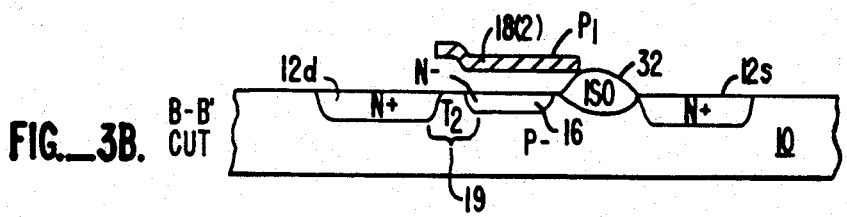
FIG._3B. B-B' CUT
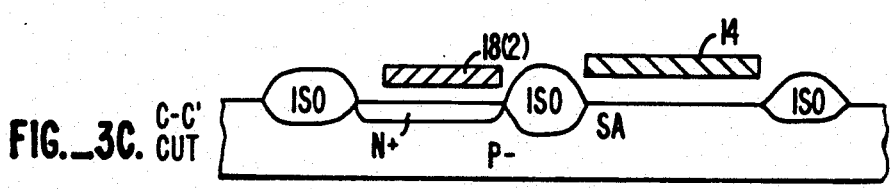
FIG._3C. C-C' CUT
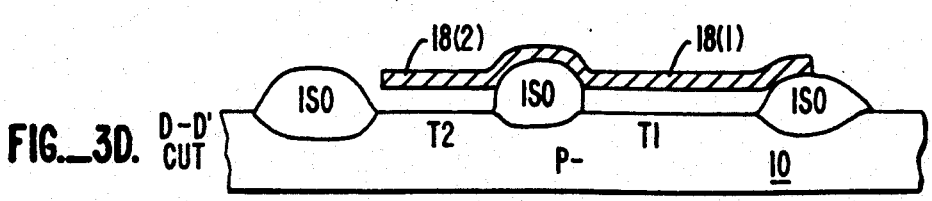
FIG._3D. D-D' CUT

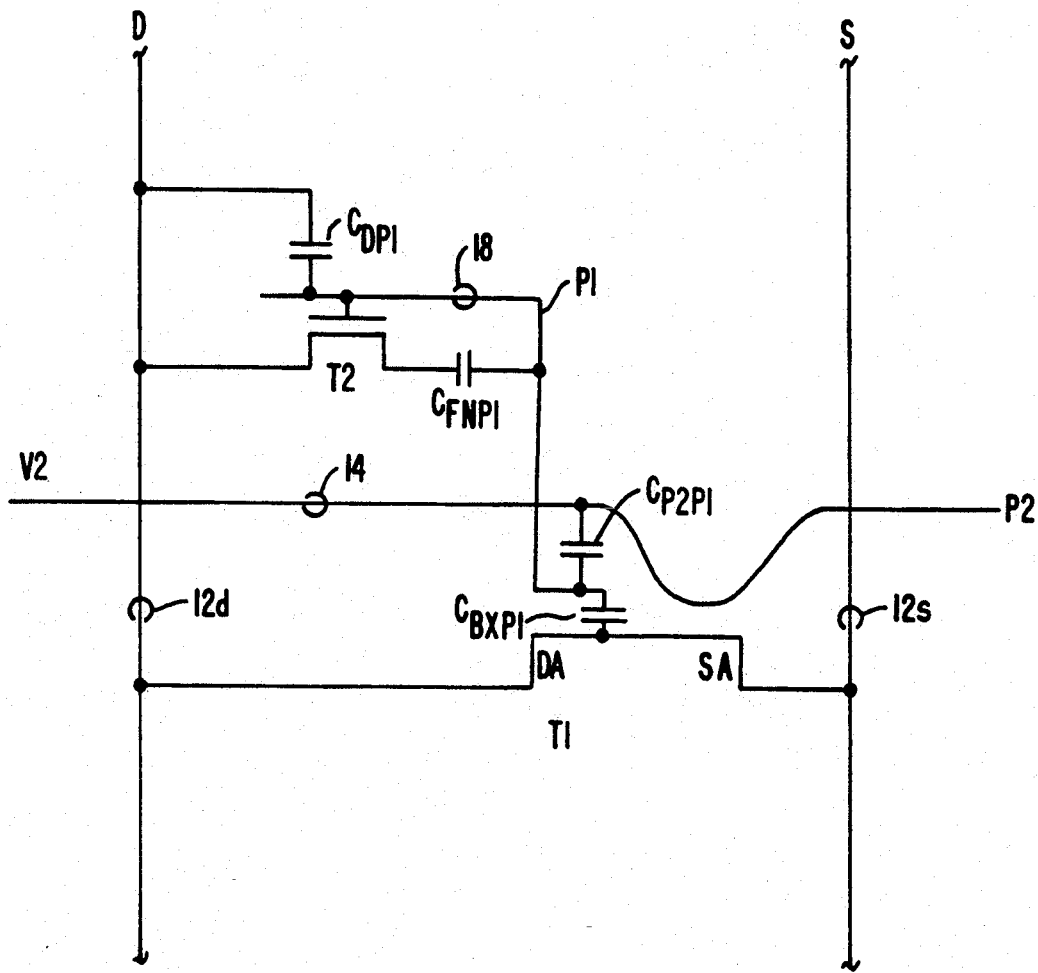
FIG._4.

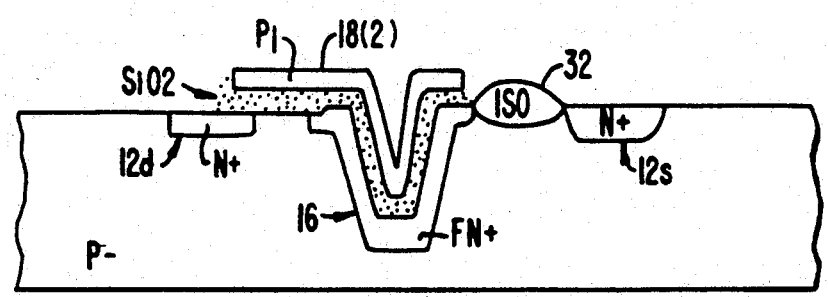
FIG._5.
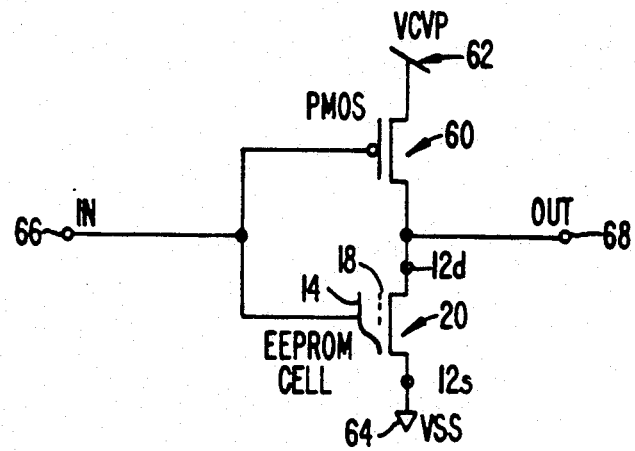
FIG._6.
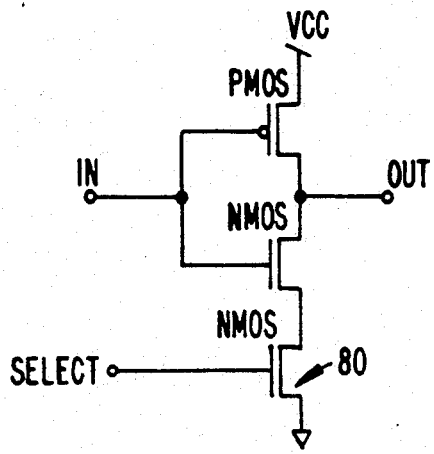
FIG._7.

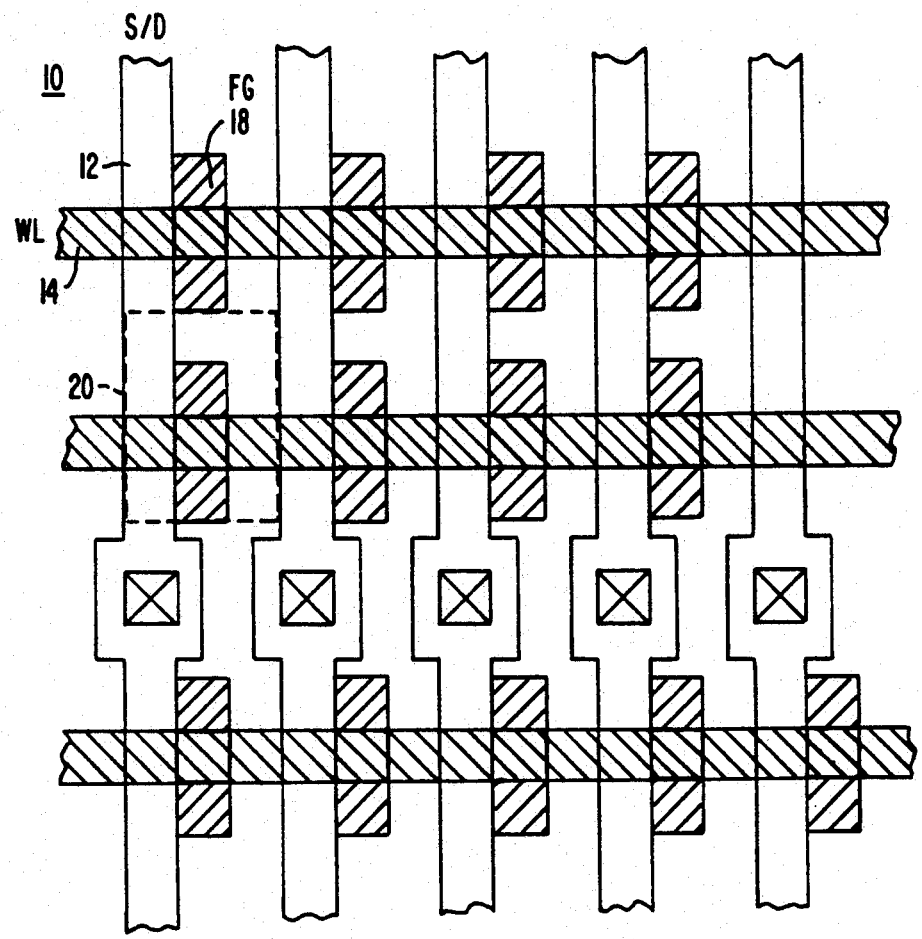
FIG._8.
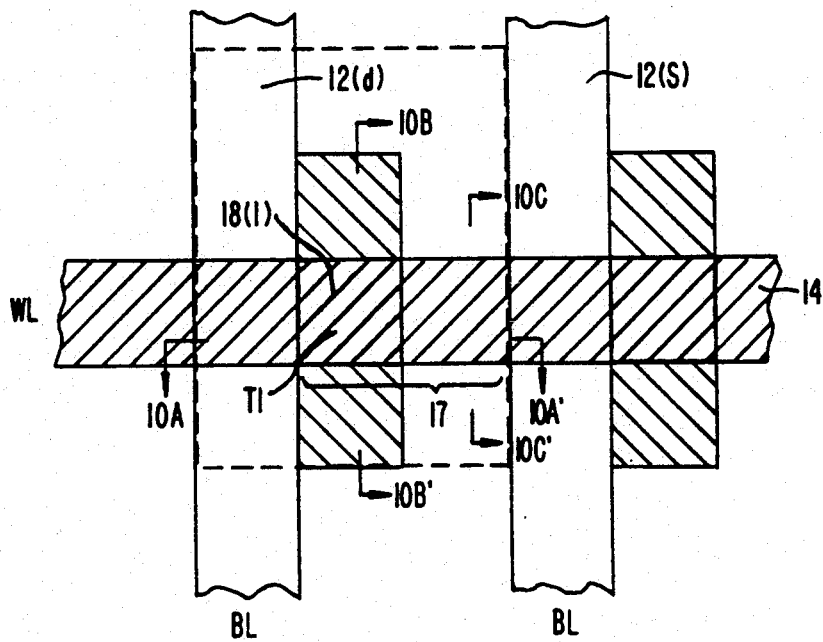
FIG._9.

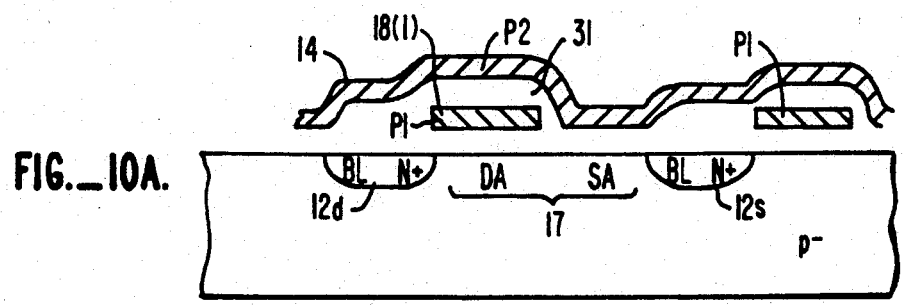
FIG._10A.
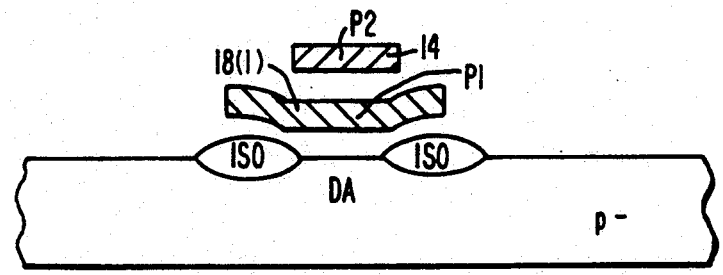
FIG._10B.
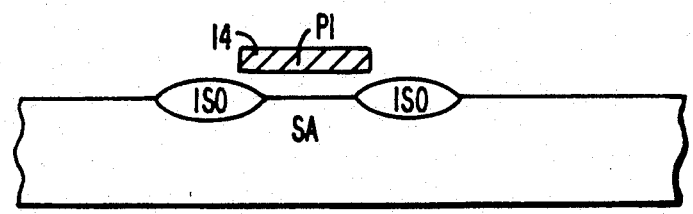
FIG._10C.
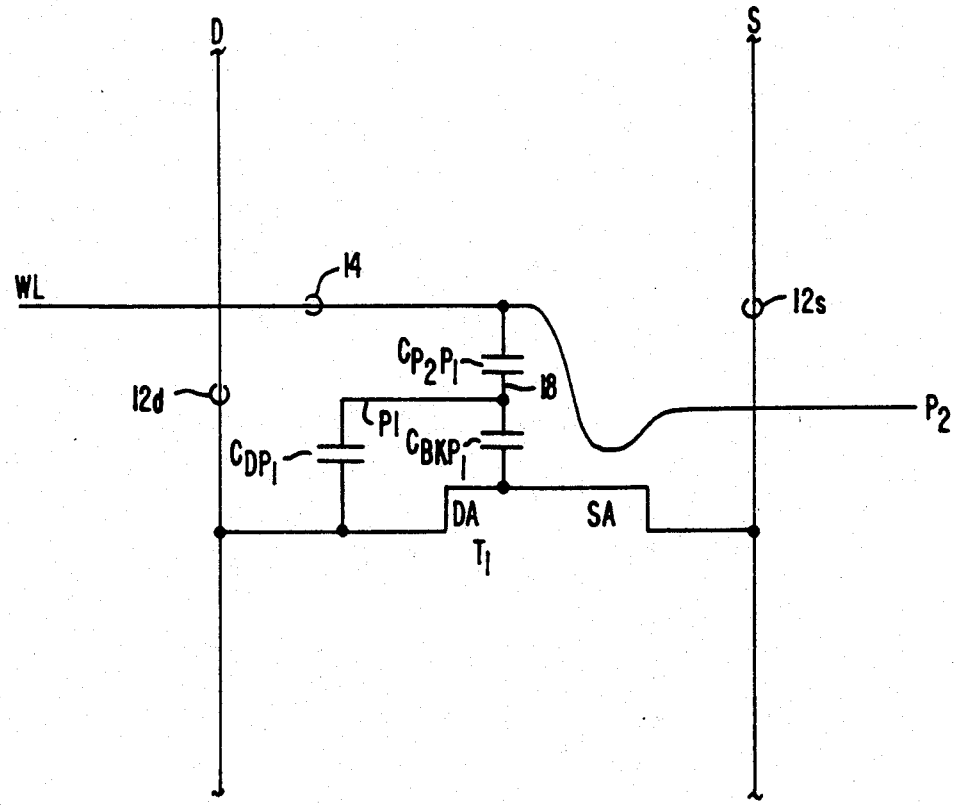
FIG._11.

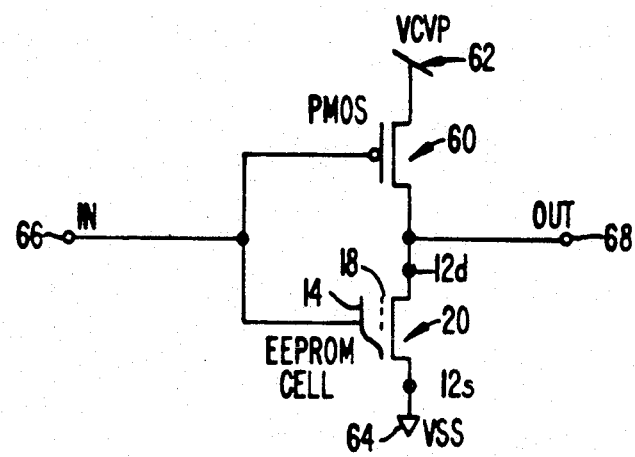
FIG._12.

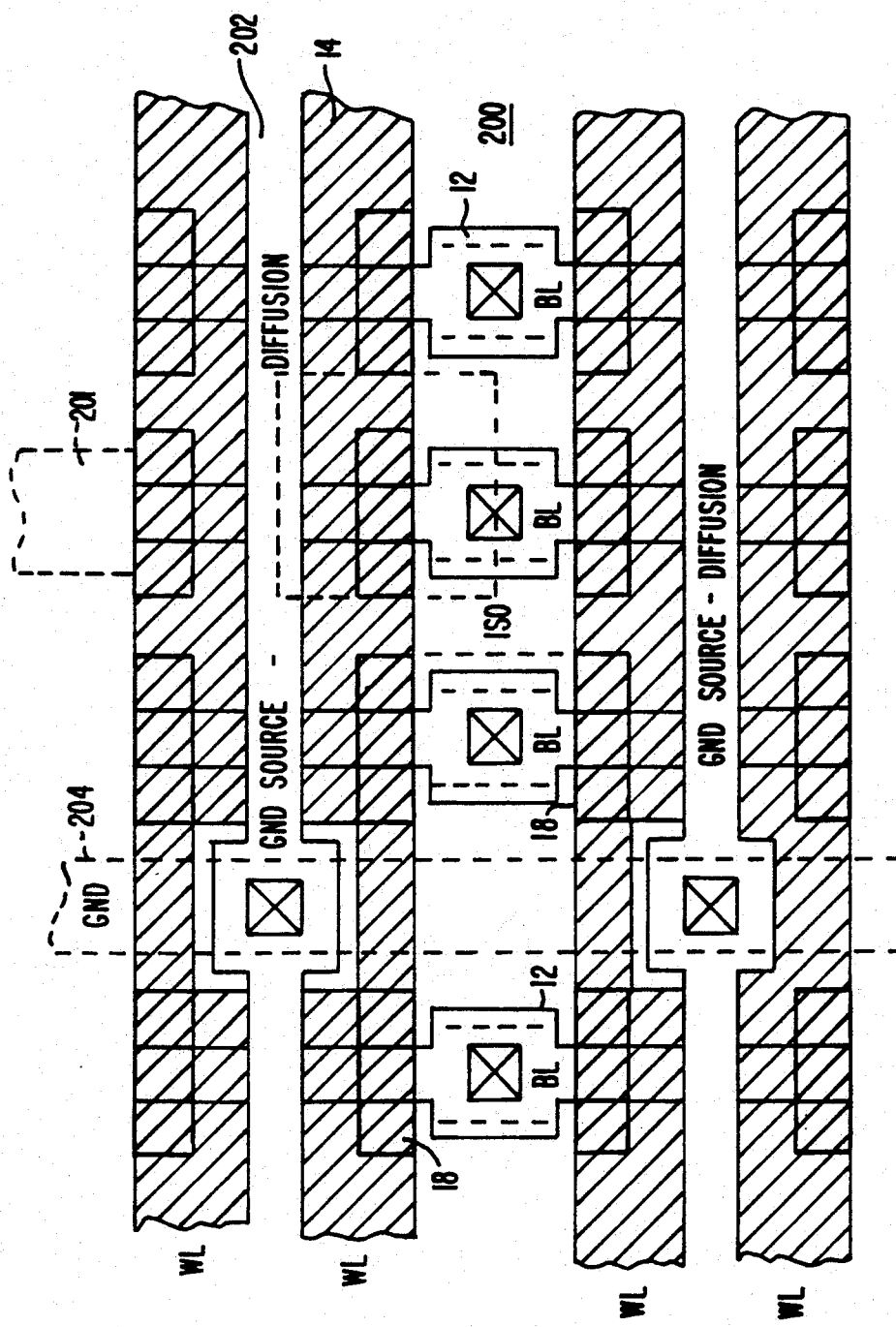
FIG._13.

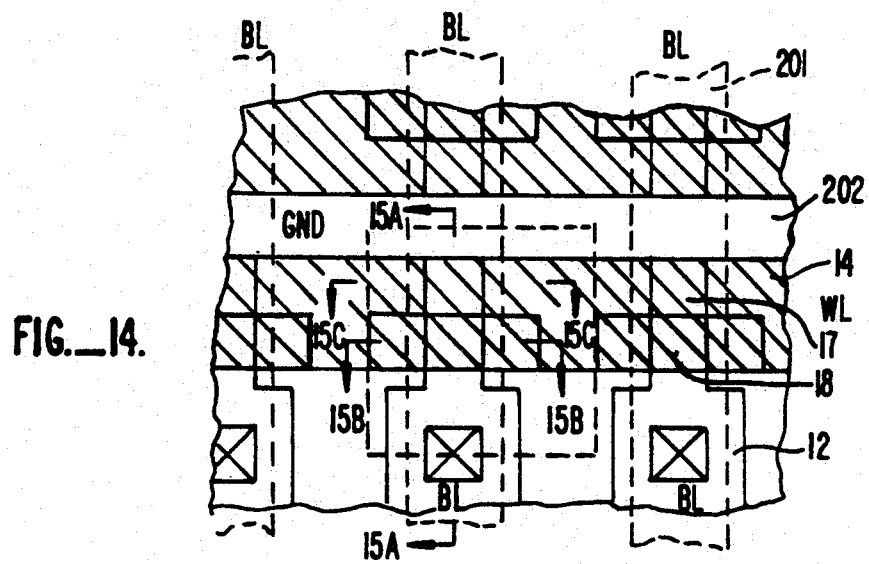
FIG._14.
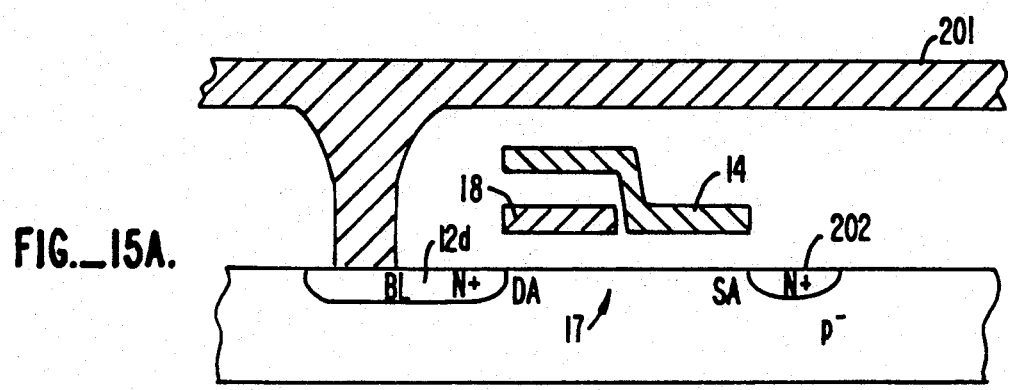
FIG._15A.
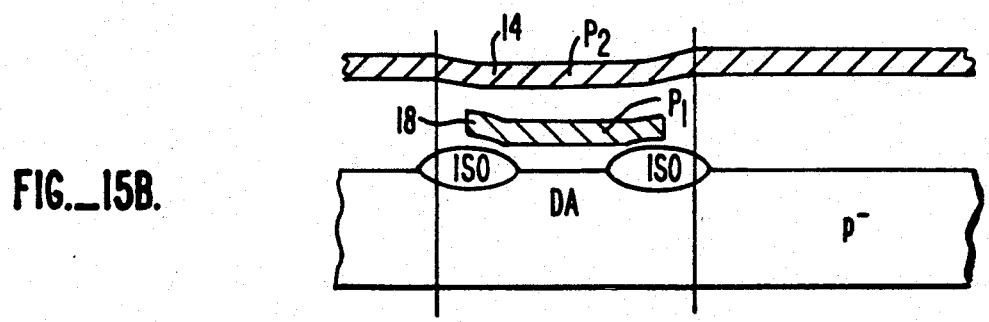
FIG._15B.
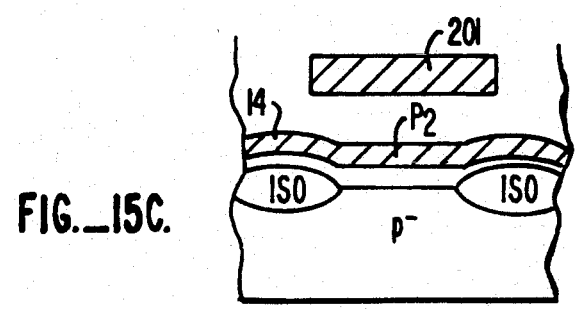
FIG._15C.

E²PROM CELL ARRAY INCLUDING SINGLE CHARGE EMITTING MEANS PER ROW

This application is a continuation-in-part of application Ser. No. 07/327,663 filed Mar. 22, 1989, issued as U.S. Pat. No. 5,047,814 which is a continuation-in-part of Ser. No. 07/152,702, now issued as U.S. Pat. No. 4,845,538 filed Feb. 5, 1988.

BACKGROUND OF THE INVENTION

1. Field of the Invention

The present invention relates generally to non-volatile semiconductor read only memory (ROM) systems and, more particularly, relates to an improved electrically erasable programmable read only memory (E²PROM).

2. Description of the Relevant Art

A great amount of research is being directed to improving E²PROM memory systems. It is anticipated that these systems will eventually replace disk drives thereby substantially reducing the cost and read access time of storage in digital systems.

An E²PROM cell is essentially an MOS transistor including source and drain diffusions coupled by a channel, a word line positioned over the channel, and a programmable floating gate positioned under the word line and above the channel. The cell stores a first binary state when the floating gate is charged with excess electrons and stores a second binary state when the floating gate is not charged with excess electrons.

During a read operation the drain diffusion is charged to $V_D(R)$ and the word line is charged to $V_{WL}(R)$. If the floating gate is not charged, then the channel is inverted, current flows between the source and drain, and the voltage level of the drain diffusion decreases. This decrease is sensed to indicate that the second binary state is stored in the cell. If the floating gate is charged, then the threshold voltage of the MOS transistor is increased, the channel is not inverted, no current flows between the source and drain, and the voltage level of the drain diffusion does not decrease. This voltage level is sensed and indicates that the first binary state is stored in the cell.

Two methods utilized to charge the floating gate will now be described. The first method is to increase the potential difference between the source and drain diffusion to a level that induces avalanche breakdown at the drain junction. High energy electrons (hot electrons) will penetrate the oxide layer separating the floating gate from the channel and program the floating gate.

The second method is to cause electrons to tunnel from a grounded programming poly diffusion to the floating gate through a special tunnelling oxide layer. This tunnelling method requires three poly layers. The first layer is grounded and provides electrons during the charging operation, the second layer forms the floating gates, and the third layer forms the word lines. A select transistor must be included in each cell to allow discharging the floating gate of a single cell in a row.

The discharging of the floating gates will now be described. In the hot electron embodiment, the word line is charged to a relatively high erase voltage level $V_{WL}(E)$ and the floating gate is capacitively coupled to a grounded drain electrode through the isolation oxide. Electrons then tunnel from the floating gate to the word line through a tunnelling oxide layer. Similarly, in the tunnelling embodiment, the first poly layer is grounded and the second poly layer is coupled to ground via high capacitive ratio between the layers. The word line is charged to $V_{WL}(E)$ and electrons tunnel from the floating gate to the word line.

Both types of systems have advantages and drawbacks. Turning first to the hot electron type of system, the structure only requires two poly layers and is thus easier to fabricate. However, hot electrons transferred via the oxide damage the oxide thereby reducing the number of programming cycles. Additionally, the production of hot electrons requires an off-chip power source capable of generating significant current. Further, the weak coupling of the floating gate to ground requires that the magnitude of the erase voltage be high. When arranged in an array matrix, selective cells cannot be erased without the erasure of the entire array.

Turning next to the tunnelling system, the program and erase operations are less stressful to the oxide and more cycles are possible. Additionally, less current is drawn than in the hot electron system. However, during the erase operation extraneous electrons tunnel from the first poly to the word line and thus cause excess stress to the oxide and higher than necessary current flow. Further, the three poly layer structure is complex and requires four control signal contacts, i.e., source, drain, word line, and select.

In view of the above, it is apparent that an improved E²PROM system facilitating the use of an on-chip power supply, utilizes only two poly layers, and provides for a high number of program cycles is greatly required.

SUMMARY OF THE INVENTION

The present invention is an improved E²PROM cell that utilizes electron tunnelling from the word line to the floating gate and includes only first and second poly layers. Only three control signals are required to read, program, or erase the cell.

In a preferred embodiment, the cells are formed along the major surface of a P⁻doped semiconductor substrate and arranged in a rectangular array at the intersections of vertical bit line diffusions and horizontal poly word lines. Each cell includes a modified first MOS transistor including a first channel region, disposed below the word line, connecting the source and drain diffusion. This first MOS transistor has a stacked poly gate with a floating gate having a first region underlying the word line and overlying a drain area of the channel of the transistor. The channel also includes a source area over which the floating gate is not disposed. The state of the bit stored in the cell depends on whether the floating gate is charged.

Each cell also includes a control region that is geometrically isolated from the source and drain diffusions. A second region of the floating gate overlies this control region so that the floating gate is strongly capacitively coupled to the control diffusion region. Additionally, the second region of the floating gate overlies a second channel region of a second transistor coupling the drain diffusion and control diffusion region. Further, this second region of the floating gate is adapted to be capacitively coupled to the drain diffusion.

According to one aspect of the invention, a selected cell is programmed by charging its drain diffusion to a programming voltage level and grounding its word line. The voltage level on the floating gate increases, due to the capacitive coupling to the drain and drain area of the channel to invert the second channel region and couple the control diffusion region to the drain. Thus the control region is charged to programming voltage and this voltage is strongly coupled to the floating gate by the floating gate/ control region capacitance.

According to a still further aspect of the invention, a selected cell is erased by grounding its drain and charging its word line to an erase voltage. A sufficient potential difference is generated to cause electrons to tunnel from the floating gate to the word line. For unselected cells in the same column, word lines and drain are grounded. This voltage prevents the generation of a potential difference to cause tunnelling from the floating gate to the word line. Accordingly, a single cell in a column may be erased.

In one embodiment, a single cell is utilized as a circuit element that functions as an NMOS transistor having a programmable threshold voltage level. The three NMOS transistor control signals, $V_S$, $V_D$, and $V_G$, are coupled to the source diffusion drain diffusion, and P2 layer respectively.

For unselected cells in the same column, the word-lines are charged to an intermediate voltage to prevent the generation of sufficient potential difference to cause tunnelling from the word-lines to the floating gates. Accordingly, a single cell in a column may be erased.

The present cell causes very little stress to be placed on the oxide during the program and erase operations and can be reliably subjected to many such operations. As described above, tunnelling between the word line and floating gate is the least stressful method of programming and erasing. Further, extraneous current flow is eliminated due to the efficient geometry of the system.

According to one embodiment of the invention, a memory cell includes a floating gate capacitively coupled to the drain region that does not require a separate control region. A selected cell is programmed by charging its drain diffusion to a programming voltage level and grounding its word line. The voltage level on the floating gate increases, due to the capacitive coupling to the drain and drain area of the channel. At this biasing condition no current flows from drain to source because the source area of the channel is not inverted.

According to a still further aspect of the invention, a selected cell is erased by grounding its drain and charging its word line to an erase voltage. A sufficient potential difference is generated to cause electrons to tunnel from the floating gate to the word line. For unselected cells in the same column, word lines and drain are grounded. This voltage prevents the generation of a potential difference to cause tunnelling from the floating gate to the word line. Accordingly, a single cell in a column may be erased.

Other features and advantages of the invention will become apparent in view of the drawings and following detailed description

BRIEF DESCRIPTION OF THE DRAWINGS

FIG. 1 is a top view of a preferred embodiment of the array:

FIG. 2 is a top view of a preferred embodiment of a cell;

FIGS. 3A-3D are cross-sectional views of the cell depicted in FIG. 2:

FIG. 4 is a schematic diagram of an electrical model of the cell;

FIG. 5 depicts an alternative structure for $C_{FNP1}$;

FIG. 6 depicts a CMOS circuit including the cell of the present invention: and

FIG. 7 depicts a standard configuration of the circuit of FIG. 6.

FIG. 8 is a top view of a second preferred embodiment of the array:

FIG. 9 is a top view of a second preferred embodiment of a cell;

FIGS. 10A1-10C are cross-sectional views of the cell depicted in FIG. 9:

FIG. 11 is a schematic diagram of an electrical model of the cell depicted in FIGS. 9 and 10; and FIG. 12 depicts a CMOS circuit including the cell of the present invention:

FIG. 13 is a top view of a third preferred embodiment of the array:

FIG. 14 is a top view of a third preferred embodiment of a cell: and

FIGS. 15A-15C are cross-sectional views of the cell depicted in FIG. 14.

DETAILED DESCRIPTION OF THE PREFERRED EMBODIMENTS

FIG. 1 depicts the overall layout of the array of E$^2$-PROM memory cells. Referring now to FIG. 1, the array is laid out on the major surface 10 of a P$^-$doped monocrystalline silicon substrate. A first set of equispaced, vertical N$^+$regions 12 form the source/drain lines of the array. These source/drain lines are crossed by a first set of equispaced, horizontal polysilicon word lines 14. A second set of rectangular N$^+$control regions 16 are disposed between the source/drain regions 12 and geometrically isolated therefrom. A second set of floating gate poly layers 18 each include a first region disposed below an associated word line 14 and a second region disposed over an associated control region 16.

The word lines 14 and floating gates 18 are formed from separate poly layers that are deposited over the substrate and then selectively etched. Because the floating gates 18 are partially disposed below the word line 14, the layer utilized to form the floating gates is deposited first and the floating gates are referred to as poly 1 or P1. Similarly, the word lines are often referred to as poly 2 or P2. This terminology is utilized herein. A basic memory cell 20 is defined at the intersection of each source/drain line 12 and word line 14. The structure of the cell will now be described with reference to FIGS. 2 and 3A-3D.

In FIG. 2, the basic cell 20 is depicted with the drain line 12d positioned at the left and the source line 12s positioned at the right. Note that the line 12d functions as the source for the cell 20(l) disposed to the left of the cell depicted and the line 12s functions as the drain for the cell 20(r) disposed to the right of the cell depicted.

In FIG. 2, two transistors, T1 and T2, are depicted with both transistors having drain line 12d as their drains. Transistor T1 has the source line as its source, a first channel region 17 of the major surface underlying the word line 14 as its channel, and a stacked gate structure including the first region 18(1) of the floating gate 18 and the word line 14 as its control electrode. Transistor T2 has the control region 16 as its source, a second region 18(2) of the floating gate 18 as its gate, and a second channel region 19 of the major surface 10 disposed between the control region 16 and drain line 12d as its channel.

FIGS. 3A-3D are cross-sectional views taken along the cuts A—A', B—B', C—C', and D—D', respectively, of FIG. 2. FIG. 3A is a cross-sectional view of transistor T1. In FIG. 3A, the channel 17 of T1 includes a drain area DA disposed adjacent to the drain line 12d and below the first region 18(1) of the floating gate 18 and a source area SA disposed adjacent to the source line 12s and beneath the section of the word line 14 that does not overlay the floating gate 18.

During the program and erase operations electrons tunnel through the oxide layer 31 separating the first region 18(1) of the floating gate 18 and the word line 14. Generally, when a poly layer is deposited, the upper surface has small convex disks dispose thereon and the lower layer has small concave cups disposed thereon. It is well-known that the forward threshold required to induce tunnelling from a lower poly layer to an upper poly layer is lower than the reverse threshold voltage required to induce tunnelling from the upper poly layer to the lower layer.

FIG. 3B is a cross-sectional view of the transistor T2. A boundary of the floating gate 18 is adjacent to the drain line 12d and almost completely overlies the control region 16. The control region 16 and source line 12s are isolated by a field oxide region 32. FIGS. 3C and 3D depict the isolation of the N+ regions and channel regions by the field oxide layers.

FIG. 4 is an electrical schematic diagram illustrating the capacitive coupling of the floating gate P1 18 to the drain line 12d ($C_{DP1}$), to the word line (P2) 14 ($C_{P2P1}$), to the control diffusion 16 ($C_{FNP1}$), and to the bulk semiconductor ($C_{BKP1}$). The magnitude of these capacitances is determined by the area of overlap between P1 and the various circuit elements and the thickness of the oxide layer separating the structures.

In FIG. 4, the upper and lower plates of $C_{DP1}$ are, respectively, the adjacent sections of the drain line 12d and the left edge of the floating gate 18. The left and right plates of $C_{FNP1}$ are, respectively, the control region 16 and the section of the second region 18(2) overlying the control region. This coupling is much stronger than the drain/floating gate coupling because of the large overlap and the thinner oxide thickness. The upper and lower plates of $C_{P2P1}$ are, respectively, the overlapping regions of the word line 14 and first region 18(1). Finally, the lower and upper plates of $C_{BKP1}$ are, respectively, the bulk area of the channel of T1 and the first region 18(1) of the floating gate.

The following equation expresses the floating gate voltage ($V_{P1}$) in terms of the above-described capacitances, the charge ($Q_{P1}$) on the floating gate, and the voltage levels on the wordline ($V_P$), the control electrode ($V_{FN}$), the drain ($V_D$), and the bulk semiconductor substrate ($V_{BK}$):

$$V_{P1} = \frac{(-Q_{P1}) + [V_{P2} C_{P2P1} + V_{FN} C_{P1FN} + V_D C_{DP1} + V_B C_{BKP1}]}{C_{P2P1} + C_{FNP1} + C_{DP1} + C_{BKP1}} \quad \text{Eq. 1}$$

The program and erase operations will now be described for an embodiment having the dimensions shown on FIG. 2 and having the following oxide thicknesses:

$T_{P2P1}$ = 600 Angstroms
$T_{FNP1}$ = 250 Angstroms
$T_{DP1}$ = 400 Angstroms
$T_{DAP1}$ = 400 Angstroms.

For this embodiment the forward tunnelling threshold voltage level is about 8 volts, the reverse tunnelling threshold voltage level is about 12 volts, and the threshold voltage of T1 and T2 is about 0.8 volts.

Table 1 lists the voltages on the drain 12d, source 12s, and word lines 14 for programming a selected cell to store the first binary state (floating gate charged) and the same voltage states for all unselected cells. Table 1 also list the value of the current ($I_{DS}$) that flows from source to drain in T1. It is critical that unselected cells not be programmed by tunneling, or have a parasitic $I_{DS}$ current that might cause hot electron programming

TABLE 1

|  | $V_D$ | $V_S$ | $V_{P2}$ | IDS |
|---|---|---|---|---|
| Selected | 15 | 8 | 0 | 0 |
| Unselected On Same Row | 8 | 8 | 0 | 0 |
| Unselected On Same Columns | 15 | 8 | 8 | 0 |

The programming of the selected cell will now be described with reference to Table 1 and FIG. 4. The drain voltage, $V_D$, is coupled to the floating gate 18 by $C_{DP1}$ and the voltage on the floating gate rises to about 2 volts which is higher then the $V_T$ of T1. Thus the drain area DA of the channel is inverted and acts as an additional capacitor plate to couple the drain voltage to P1. This capacitor is actually $C_{BKP1}$ in FIG. 4. The source area SA of the channel is not depleted because T1 is off due to the fact that WL 14 is held at 0 V. The coupling via $C_{BKP1}$ brings the potential of P1 to above 2 volts and is sufficient to invert and deplete the channel of T2. Thus T2 is turned on to charge the lower plate (the control region 16) of $C_{FNP1}$ to $V_D$ minus the $V_T$ of T2 (0.8 V).

This voltage on the control electrode is strongly coupled to the floating gate by CFNP1. Accordingly, the voltage levels $V_{FN}$ and $V_B$ in equation 1 are equal to $V_D - V_{T2}$ and 15 V respectively. Substitution of these values into equation 1 with $Q_{P1}=0$ (floating gate not charged) and $V_{P2}=0$ (word line at ground) indicates that the magnitude of $V_{P1}$ is greater than 12 volts. Because P2 is grounded, this voltage on P1 is applied across the electrodes of $C_{P1P2}$ and exceeds the reverse threshold voltage of the oxide layer so electrons tunnel from P2 to P1.

For unselected cells in the same row, $V_D$ is 8 volts and $V_{P1}$ is about 6 volts. This voltage difference is insufficient to cause reverse tunnelling. For unselected cells in the same column, the potential of the word lines 14 is at 8 V, thus the potential difference between the floating gates 18 to the control gates 14 is about 5 volts, which is below the reverse or forward tunneling threshold. Thus these cells will not program undesirably due to tunnelling of electrons. In addition $V_{GS}$ of T1 is 0 volts, because $V_{P2}$ is 0 volts and SA is not depleted, so that no IDS exists. Thus accidental hot electron programming will not occur. Accordingly, the present system provides for programming a single cell utilizing only three control signals, $V_D$, $V_S$, and $V_{P2}$.

Thus, the coupling between the drain 12d and the floating gate 18 is sufficient to turn on T2 which, in turn, facilitates charging the control region 16 to almost the full programming voltage. From eq. 1, this high value of $V_{FN}$ multiplied by the large value of $C_{FNP1}$ results in a high value of $V_{P1}$ and facilitates the use of lower programming voltage. Additionally, very little current is drawn because the floating gate is charged by the tunnelling mechanism.

Table 2 lists the voltage levels on the drain, source, and word lines for erasing (discharging) a selected cell to erase the first binary state (floating gate charged) and the values of these voltage levels for all unselected cells. It is critical that unselected cells on the same column and different rows not be erased.

TABLE 2

|  | $V_D$ | $V_S$ | $V_{P2}$ |
|---|---|---|---|
| Selected | 0 | 0 | 15 |
| Unselected in same column | 0 | 0 | 0 |

For the selected cell, $V_D$ is at ground and $V_{P2}$ is 15 volts. In this case, equation 1 indicates that the potential difference across $C_{P2P1}$ is greater than the forward tunnelling voltage so electrons tunnel from the floating gate to the word line to erase (discharge) the floating gate. For unselected cells in the same column, $V_{P2}$ is 0 volts. In this case equation 1 indicates that the potential difference across $C_{P2P1}$ is not sufficient to cause forward tunnelling across the oxide layer. Accordingly, a single cell in a column may be erased.

An alternative structure for $C_{FNP1}$ is depicted in FIG. 5. The layout of cell 20 is as depicted in FIG. 2, however, the structure along cut B—B is as depicted in FIG. 5 instead of FIG. 2A.

Referring now to FIG. 5, the control region 16 and second region 18(2) of the floating gate are implemented as a trench structure.

The process for forming this structure is well known and is utilized in the fabrication of Megabit DRAMs. The advantages of utilizing this structure are twofold. First, the footprint of the $C_{FNP1}$ will decrease thereby reducing the area of the cell 20. Secondly, the magnitude of $C_{FNP1}$ will increase because the trench structure provides for more overlap between the layers.

Because the present cell requires only three control signals, $V_D$, $V_S$, and $V_{P1}$, its operation is analogous to a standard NMOS transistor with $V_G=V_{P1}$. However, the present cell has the additional advantage of having a programmable threshold voltage Accordingly, the cell may be advantageously incorporated into NMOS or CMOS logic arrays, gate-arrays, and other forms of programmable logic.

If the cell is utilized as a discrete circuit element then the long source and drain diffusions 12s and 12d of FIG. 2 are replaced by isolated source and drain diffusion regions and the word line 14 is replaced by an isolated control gate.

FIG. 6 is a circuit diagram of a CMOS invertor having a high-impedance output capability. Referring to FIG. 6, a PMOS transistor 60 has its source terminal coupled to a $V_CV_P$ input terminal 62 and its drain terminal coupled to the drain diffusion 12d of present cell 20. The source diffusion 12s of the cell 20 is coupled to a $V_{SS}$ terminal 64. The P2 layer 14 of cell 20 and the gate of the PMOS transistor 60 are coupled to an input terminal 66. An output terminal 68 is connected to the coupled drain terminals.

In normal operation the floating gate of the cell 20 is not charged and the threshold voltage of the cell 20 is less than 5 volts. Accordingly, when $V_{in}=5$ volts the cell 20 conducts and the PMOS transistor 60 is off so that VSS is coupled to the output terminal 68 thereby inverting the input signal. When $V_{in}=0$ volts, the PMOS transistor 60 is on, the cell 20 does not conduct and $V_CV_P$ is coupled to the output terminal 68 thereby inverting the input.

To convert to the high impedance mode the floating gate 18 of the cell is charged to increase the threshold voltage of the cell to greater than 5 volts and Vin is set to 5 volts. Thus, both the cell 20 and the PMOS transistor 60 are nonconducting thereby isolating the output terminal 68 from the input terminal 60, the $V_CV_P$ terminal 62, and the $V_{SS}$ terminal 64.

This circuit is particularly useful when the output terminals of several invertor circuits are coupled to a signal bus and it is desired to transfer information from only one of the inventors to the bus. The cells in the non-selected invertor circuits are programmed and the input voltage in held at 5 volts.

The programming or erase operations are as described above. To program the cell 20 in the circuit of FIG. 6, $V_{in}$ is set to 0 volts and $V_CV_P$ set to 15 volts. The drain 12d of the cell 20 goes to 15 volts because the PMOS transistor 60 is on. Additionally, since the source 12s and P2 layer are both at 0 volts no current flows through the cell 20. Under these bias conditions, the floating gate 18 is charged and the cell 20 is programmed to a high threshold voltage. To erase a programmed cell 20, $V_{in}$ is pulled to 15 volts and $V_CV_P$ is set at 5 volts. In this case, the PMOS transistor 60 is off and the output terminal 68 is coupled to the $V_{SS}$ terminal 64 through the cell 20. Under these conditions the floating gate 18 will discharge.

FIG. 7 is a circuit diagram of a standard CMOS circuit for implementing a CMOS invertor with a high-impedance output feature. An extra select transistor 80 is required. If the SELECT signal is low then the output is isolated and if the SELECT signal is high the circuit functions as an invertor. Several advantages of the circuit utilizing the present cell 20 (FIG. 6) are now apparent. It requires one less transistor and one less control signal and is thus easier to manufacture. Further, because of the nonvolatile nature of the cell, the circuit of FIG. 6 remains programmed in the event that power is interrupted. The circuit of FIG. 7 must be reprogrammed using special software routines.

FIG. 8 depicts the overall layout of the array of E$^2$-PROM memory cells that do not include the control regions 16. Referring now to FIG. 8, the array is laid out on the major surface 10 of a P$^-$doped monocrystalline silicon substrate. A first set of equispaced, vertical N$^+$regions 12 form the source/drain lines of the array. These source/ drain lines are crossed by a first set of equispaced, horizontal polysilicon word lines 14. A second set of floating gate poly layers 18 each include a first region disposed below an associated word line 14 and a second region disposed over an associated control region 16.

The word lines 14 and floating gates 18 are formed from separate poly layers that are deposited over the substrate and then selectively etched. Because the floating gates 18 are partially disposed below the word line 14, the layer utilized to form the floating gates is deposited first and the floating gates are referred to as poly 1 or P1. Similarly, the word lines are often referred to as poly 2 or P2. This terminology is utilized herein. A basic memory cell 20 is defined at the intersection of each source/drain line 12 and word line 14. The structure of the cell will now be described with reference to FIGS. 9 and 10A-10C.

In FIG. 9, the basic cell 20 is depicted with the drain line 12d positioned at the left and the source line 12s positioned at the right. Note that the line 12d functions as the source for the cell 20(1) disposed to the left of the cell depicted and the line 12s functions as the drain for the cell 20(r) disposed to the right of the cell depicted.

In FIG. 9, transistor T1 has the source line as its source, a first channel region 17 of the major surface underlying the word line 14 as its channel, and a stacked gate structure including the first region 18(1) of the floating gate 18 and the word line 14 as its control electrode.

FIGS. 10A-10C are cross-sectional views taken along the cuts A—A', B—B', and C—C', respectively, of FIG. 9. FIG. 10A is a cross-sectional view of transistor T1. In FIG. 10A, the channel 17 of T1 includes a drain area DA disposed adjacent to the drain line 12d and below the first region 18(1) of the floating gate 18 and a source area SA disposed adjacent to the source line 12s and beneath the section of the word line 14 that does not overlay the floating gate 18. Typical drain/source doping may by 1.0E14/cm2 Arsenic ions implanted at an energy of 50KeV.

In fabricating such a cell it is preferred that the overlap between the floating gate and the drain line 12d will be minimized, preferably by a self-align processing step, in order to prevent the drain line from pulling the floating gate voltage to such a point where the potential difference across the oxide 31 in FIG. 10A between the floating gate and the word line poly-2 is more then the 3.2 electron-Volts band-gap energy of the polysilicon to silicon-dioxide interface. Such a situation may occur when the drain line 12d serves as a source line to an adjacent cell to the left side of the present cell, in which case it is decoded by a column decoder to be near ground potential of 0 V.

A preferred overlap of less then 0.1 micrometer may be achieved by several processing methods, which are known in the art and in principal self-align the floating gate and the drain diffusion to each other. The minimum overlap of about 0.1micrometer is achieved by diffusion of the drain ion implants under the floating gate due to the thermal cycle involved in growing the oxide dielectric.

Details of self align process methods are disclosed in several U.S. patents. U.S. Pat. No. 4,122,544 issued to D. McElroy describes on page 6 lines 56 to 68 and page 7 lines 1 to 3, how to define the drain and source area by the floating gate and a photoresist and then implant the source drain implant. U.S. Pat. Nos. 4,795,719 and 4,639,893 issued to B. Eitan repeat on the McElroy concept. U.S. Pat. No. 4,794,565 issued to Wu et al. discloses two other methods in page 8 line 26 to line 68 and page 9 line 1 to line 11. Another method to self align drain diffusion implant and the floating gate is disclosed in an accompanying patent application also by E. Hazani.

FIG. 10B depicts a cross-sectional cut along line B—B' of FIG. 9, showing the drain area of the cell and a thinner oxide under the floating gate of about 250 Angstroms and a thicker oxide (31) between the floating gate and the control gate 14.

FIG. 10C depicts a cross-sectional cut along line C—C' of FIG. 9, Showing the source area of the cell, where only a control gate poly 2 is deposited.

During the program and erase operations electrons tunnel through the oxide layer 31 separating the first region 18(1) of the floating gate 18 and the word line 14. Generally, when a poly layer is deposited, the upper surface has small convex disks dispose thereon and the lower layer has small concave cups disposed thereon. It is well-known that the forward threshold required to induce tunnelling from a lower poly layer to an upper poly layer is lower than the reverse threshold voltage required to induce tunnelling from the upper poly layer to the lower layer.

FIG. 11 is an electrical schematic diagram illustrating the capacitive coupling of the floating gate P1 18 to the drain line 12d ($C_{DP1}$), to the word line (P2) 14 ($C_{P2P1}$), and to the bulk semiconductor ($C_{BKP1}$). The magnitude of these capacitances is determined by the area of overlap between P1 and the various circuit elements and the thickness of the oxide layer separating the structures.

In FIG. 11, the upper and lower plates of $C_{DP1}$ are, respectively, the adjacent sections of the drain line 12d and the left edge of the floating gate 18.

The upper and lower plates of $C_{P2P1}$ are, respectively, the overlapping regions of the word line 14 and first region 18(1). Finally, the lower and upper plates of $C_{BKP1}$ are, respectively, the bulk area of the channel of T1 and the first region 18(1) of the floating gate.

The following equation expresses the floating gate voltage ($V_{P1}$) in terms of the above-described capacitances, the charge ($Q_{P1}$) on the floating gate, and the voltage levels on the wordline ($V_{P2}$), the drain ($V_D$), and the bulk semiconductor substrate ($V_{BK}$):

$$V_{P1} = \frac{(-Q_{P1}) + [V_{P2} C_{P2P1} + V_D C_{DP1} + V_B C_{BKP1}]}{C_{P2P1} + C_{DP1} + C_{BKP1}} \qquad \text{Eq. 2}$$

The program and erase operations will now be described for an embodiment having the dimensions shown on FIG. 2 and having the following oxide thicknesses:

$T_{P2P1} = 600$ Angstroms
$T_{DP1} = 250$ Angstroms
$T_{DAP1} = 250$ Angstroms.

For this embodiment the forward tunnelling threshold voltage level is about 8 volts, the reverse tunnelling threshold voltage level is about 12 volts, and the threshold voltage of T1 is about 0.8 volts.

Table 3 lists the voltages on the drain 12d, source 12s, and word lines 14 for programming a selected cell to store the first binary state (floating gate charged) and the same voltage states for all unselected cells. Table 3 also list the value of the current ($I_{DS}$) that flows from source to drain in T1. It is critical that unselected cells not be programmed by tunneling, or have a parasitic $I_{DS}$ current that might cause hot electron programming.

TABLE 3

|  | $V_D$ | $V_S$ | $V_{P2}$ | IDS |
| --- | --- | --- | --- | --- |
| Selected | 18 | 9 | 0 | 0 |
| Unselected On Same Row | 9 | 9 | 0 | 0 |
| Unselected On Same Columns | 18 | 9 | 9 | 0 |

The programming of the selected cell will now be described with reference to Table 3 and FIG. 11. The drain voltage, $V_D$, is coupled to the floating gate 18 by $C_{DP1}$ and the voltage on the floating gate rises to about 2 volts which is higher then the VT of T1. Thus the drain area DA of the channel is inverted and acts as an additional capacitor plate to couple the drain voltage to P1. This capacitor is actually $C_{BKP1}$ in FIG. 11. The source area SA of the channel is not depleted because T1 is off due to the fact that WL 14 is held at 0 V.

Accordingly, the voltage level $V_B$ in equation 2 is equal to $V_D$. Substitution of this value into equation 1 with $Q_{P1}=0$ (floating gate not charged) and $V_{P2}=0$ (word line at ground) indicates that the magnitude of $V_{P1}$ is greater than 12 volts. Because P2 is grounded, this voltage on P1 is applied across the electrodes of $C_{P1P2}$ and exceeds the reverse threshold voltage of the oxide layer so electrons tunnel from P2 to P1.

For unselected cells in the same row, $V_D$ is 9 volts and $V_{P1}$ is about 6 volts. This voltage difference is insufficient to cause reverse tunnelling. For unselected cells in the same column, the potential of the word lines 14 is at 9 V, thus the potential difference between the floating gates 18 to the control gates 14 is about 5 volts, which is below the reverse or forward tunneling threshold. Thus these cells will not program undesirably due to tunnelling of electrons. In addition $V_{GS}$ of T1 is 0 volts, because $V_{P2}$ is 0 volts and SA is not depleted, so that no $I_{DS}$ exists. Thus accidental hot electron programming will not occur. Accordingly, the present system provides for programming a single cell utilizing only three control signals, $V_D$, $V_S$, and $V_{P2}$.

Thus, very little current is drawn because the floating gate is charged by the tunnelling mechanism.

Table 4 lists the voltage levels on the drain, source, and word lines for erasing (discharging) a selected cell to erase the first binary state (floating gate charged) and the values of these voltage levels for all unselected cells. It is critical that unselected cells on the same column and different rows not be erased.

TABLE 4

|  | $V_D$ | $V_S$ | $V_{P2}$ |
|---|---|---|---|
| Selected | 0 | 0 | 15 |
| Unselected in same column | 0 | 0 | 0 |

For the selected cell, $V_D$ is at ground and $V_{P2}$ is 15 volts. In this case, equation 1 indicates that the potential difference across $C_{P2P1}$ is greater than the forward tunnelling voltage so electrons tunnel from the floating gate to the word line to erase (discharge) the floating gate. For unselected cells in the same column, $V_{P2}$ is 0 volts and equation 2 indicates that the potential difference across $C_{P2P1}$ is not sufficient to cause forward tunnelling across the oxide layer Accordingly, a single cell in a column may be erased.

Because the present cell requires only three control signals, $V_D$, $V_S$, and $V_{P1}$, it operation is analogous to a standard NMOS transistor with $V_G=V_{P1}$. However, the present cell has the additional advantage of having a programmable threshold voltage. Accordingly, the cell may be advantageously incorporated into NMOS or CMOS logic arrays, gate-arrays, and other forms of programmable logic.

If the cell is utilized as a discrete circuit element then the long source and drain diffusions 12s and 12d of FIG. 9 are replaced by isolated source and drain diffusion regions and the word line 14 is replaced by an isolated control gate.

FIG. 13 depicts the overall layout of the array of E²PROM memory cells that do not include the control regions 16. Referring now to FIG. 13, the array is laid out on the major surface 10 of a P⁻ doped monocrystalline silicon substrate. A set of bit line diffusions 12 are isolated by oxide isolation regions 200 and connected by a BL metallization 201 to provide lower bit line capacitance. Horizontal source diffusions 202 are connected by a GND metallizations 204. A first set of equispaced, horizontal polysilicon word lines 14 are disposed over the major surface 10 and between the bit line diffusions 12 and the source diffusions 202. The region of the major surface 10 disposed below the word line and between the BL diffusion 12 and surface diffusion 202 forms a channel 17. A second set of floating gate poly layers 18 are disposed below an associated word line 14 and have a coupling edge oriented adjacent to the edge of the BL diffusion 12 that abuts the channel region 17.

The word lines 14 and floating gates 18 are formed from separate poly layers that are deposited over the substrate and then selectively etched. Because the floating gates 18 are partially disposed below the word line 14, the layer utilized to form the floating gates is deposited first and the floating gates are referred to as poly 1 or P1. Similarly, the word lines are often referred to as poly 2 or P2. This terminology is utilized herein. A basic memory cell 20 is defined at the intersection of each bit line diffusion 12 and word line 14. The structure of the cell will now be described with reference to FIGS. 14 and 15A-15C.

In FIG. 14, the basic cell 20 is depicted with the bit line diffusion 12 positioned at the bottom and the source line diffusion positioned at the top.

In FIG. 14, transistor T1 is oriented vertically has the source diffusion 202 as its source, a first channel region 17 of the major surface underlying the word line 14 as its channel, and a stacked gate structure including the floating gate 18 and the word line 14 as its control electrode.

FIGS. 15A-15C are cross-sectional views taken along the cuts A—A', B—B', and C—C', respectively, of FIG. 14. FIG. 15A is a cross-sectional view of transistor T1. In FIG. 15A, the channel 17 of T1 includes a drain area DA disposed adjacent to the bit line diffusion 12 and below the first region 18(1) of the floating gate 18 and a source area SA disposed adjacent to the source diffusion 202 and beneath the section of the word line 14 that does not overlay the floating gate 18. Typical bit line diffusion doping may be 1.0E14/cm2 Arsenic ions implanted at an energy of 50KeV.

In fabricating such a cell it is preferred that the overlap between the edge of the floating gate and the bit line diffusion 12 will be minimized, preferably by a self-align processing step, in order to prevent the drain line from pulling the floating gate voltage to such a point where the potential difference across the oxide 31 in FIG. 15A between the floating gate and the word line poly-2 is more then the 3.2 electron-Volts band-gap energy of the polysilicon to silicon-dioxide interface. Such a situation may occur when the drain line 12d serves as a source line to an adjacent cell to the left side of the present cell, in which case it is decoded by a column decoder to be near ground potential of 0 V.

A preferred overlap of less then 0.1 micrometer may be achieved by several processing methods, which are known in the art and in principal self-align the floating gate and the drain diffusion to each other. The minimum overlap of about 0.1 micrometer is achieved by diffusion of the drain ion implants under the floating gate due to the thermal cycle involved in growing the oxide dielectric.

Details of self align process methods are described above.

FIG. 15B depicts a cross-sectional cut along line B—B' of FIG. 14, showing the drain area of the cell and a thinner oxide under the floating gate of about 250 Angstroms and a thicker oxide (31) between the floating gate and the control gate 14.

FIG. 15C depicts a cross-sectional cut along line C—C' of FIG. 14, Showing the source area of the cell, where only a control gate poly 2 is deposited.

The invention has now been described with reference to several embodiments. Substitutions and alternatives will now be apparent to persons of ordinary skill in the art. In particular, the doping level along the boundary of the floating gate adjacent the drain diffusion can be enhanced to increase the capacitive coupling between the drain and the floating gate. Alternatively, this boundary could slightly overlap the drain diffusion to increase this coupling. Further, if desired, it is possible to charge the floating gate utilizing the hot electron method by supplying a signal to the word line during the programming operation. Modification of the array architecture can easily be done by separating adjacent diffusion bit lines with isolation column for every cell or for every other cell. Alternatively the floating gates along a given column may be placed close to a diffusion bit line under an even numbered word lines, thus making the bit line a drain. Here the floating gates under an odd numbered word line along the same column will be placed away from the diffusion bit line, thus making the bit line a source. This is done in a fashion similar to FIG. 2 of U.S. Pat. No. 4,763,299 issued to E. Hazani, without the need of the 45° angle tilt. Although the preferred embodiments have been described in terms of NMOS, the cell is easily adaptable to operate as a PMOS transistor if the drain and source diffusions are P+ diffusions and the substrate is N+ doped. Additionally the substrate could be comprised of germanium or GaAs. Accordingly, it is not intended that the invention be limited except as provided by the appended claims.

What is claimed is:

1. A programmable non-volatile memory comprising:
   a substrate having a major surface;
   a first insulator disposed over said surface of said substrate;
   an array of M×N programmable non-volatile memory cells organized into M rows oriented horizontally and N rows oriented vertically formed on said substrate;
   each of said horizontal rows having impurities regions that are integrally formed in said substrate, said impurities regions are positioned so that they are laterally spaced apart within each of said horizontal rows, said impurities regions do not emit or collect charge through said first insulator;
   at least one of said horizontal rows includes only a single charge emitting means that is common to a plurality of memory cells within said horizontal row and not common to said memory cells that are within a given vertical row or within adjacent horizontal rows; and
   said single charge emitting means is the only conductor means that is connected to a plurality of adjacent memory cells within said horizontal row and is not connected to said memory cells along a given vertical row or within adjacent horizontal rows of said array.

2. The memory of claim 1 wherein said single charge emitting means is electrically insulated from said substrate.

3. The memory of claim 1 wherein each of said memory cells includes a floating gate and said single charge emitting means is insulatively disposed over a row of said floating gates in at least one of said M horizontal rows.

4. A programmable non-volatile memory comprising:
   a substrate having a major surface;
   an array of M×N programmable non-volatile memory cells organized into M rows oriented horizontally and N columns oriented vertically formed on said substrate;
   each of said horizontal rows having impurities regions that are integrally formed in said substrate, said impurities regions are positioned so that they are laterally spaced apart within each of said horizontal rows;
   at least one of said horizontal rows includes only a single charge emitting means that is common to a plurality of memory cells along said horizontal row and not common to memory cells that are within a given vertical row or within adjacent horizontal rows; and
   said single charge emitting means is the only conductor means that is connected to a minimum of three adjacent memory cells along said horizontal row of said array, and said conductor means is not connected to said memory cells that are within adjacent horizontal rows.

5. The memory of claim 4 wherein said single charge emitting means is electrically insulated from said substrate.

6. The memory of claim 4 wherein each memory cell includes a floating gate and wherein said single charge emitting means is insulatively disposed over a row of said floating gates in at least one of said M horizontal rows.

7. The memory of claim 4 wherein said common conductive means emits charge during programming of memory cells associated with its row.

8. The memory of claim 7 wherein each of said memory cells further includes an insulated floating gate and wherein said charge is absorbed by at least one of said floating gates that is associated with the horizontal row of said charge emitting means.

9. The memory of claim 8 wherein every two of said impurities regions form source and drain respectively of an electrically programmable MOS field effect transistor.

10. The memory of claim 4 wherein all horizontal rows of said array include the same number of said memory cell.

11. The memory of claim 4 wherein all horizontal rows of said array include an identical single charge emitting means.

12. The memory of claim 1 wherein all horizontal rows of said array include an identical single charge emitting means.

13. An electrically programmable and erasable memory device formed on a semiconductor substrate and having a plurality of storage sites, a plurality of row lines, a plurality of column lines, and a common line, wherein each combination of one of said plurality of row lines and one of said plurality of column lines define a different one of said plurality of storage sites, and further wherein each of said plurality of storage sites comprises a single field effect transistor that has a threshold voltage, said single transistor comprising:
   a source region formed in said substrate and coupled to said common line;

a drain region formed in said substrate and coupled to an associated one of said plurality of column lines;

a control gate coupled to an associated one of said plurality of row lines;

an electrically conductive floating gate positioned between said control gate and said source region and said drain region and being capacitively coupled to said drain region;

means for injecting electrons generated by an abrupt potential change onto said floating gate when: (a) said associated column line is biased to a first predetermined potential that is above the potential of said common line and (b) when said associated row line is biased to a second predetermined potential that is not more positive than the potential of said common line by more than one threshold voltage of said transistor and said second potential is not negative, with the first potential applied to said associated one of said column lines being more positive than said second potential applied to said associated one of said row lines; and means for inducing Fowler-Nordheim tunneling of charges from said floating gate to said control gate when said associated row line is raised to a second predetermined potential more positive than the potential of said associated column line.

14. The device of claim 13 wherein the injecting and inducing means comprises:

a first layer of insulating material, having a dielectric constant, positioned between said floating gate and said drain for providing a capacitance between said floating gate and said drain; and a second layer of insulating material having a dielectric constant, positioned between said floating gate and said control gate and for permitting Fowler-Nordheim tunneling therebetween.

15. The device of claim 13 wherein the floating gate has a textured surface.

16. An electrically programmable and erasable field effect memory transistor having a threshold voltage and comprising:

a semiconductor substrate of a first conductivity type;

first and second spaced-apart regions formed in said substrate of a second conductivity type, with a channel region therebetween;

a first insulating layer disposed over said substrate including over said first, second and channel regions;

an electrically conductive floating gate disposed over said first insulating layer and extending over a portion of said channel region and over a portion of said second region;

a second insulating layer disposed over and adjacent said floating gate and having a thickness permitting Fowler-Nordheim tunneling of charge therethrough;

an electrically conductive control gate having two electrically connected sections, a first section disposed over said first insulating layer, spaced apart from said floating gate and adjacent to said second insulating layer, extending over a portion of said first region; said second section disposed over said second insulating layer;

means for injecting electrons generated by an abrupt potential change onto said floating ate when: (a) said drain region is biased to a first predetermined potential that is more positive than the potential of said source region and (b) said control gate is biased to a second predetermined potential that is not more positive than the potential of said source region by more than one threshold voltage of said transistor and said second potential is not negative, with the first potential applied to said drain region being more positive than the second potential applied to said control gate; and means for inducing Fowlernordheim tunneling of charges from said floating gate to said control gate when said control gate is biased to a third predetermined potential more positive than the potential of said drain region.

17. The device of claim 16 wherein said injecting and inducing means comprises:

a first layer of insulating material, having a dielectric constant, positioned between said floating gate and said drain for providing a capacitance between said floating gate and said drain; and a second layer of insulating material having a dielectric constant, positioned between said floating ate and said control gate and for permitting Fowler-Nordheim tunneling therebetween.

* * * * *